United States Patent
Takashima

(10) Patent No.: US 8,990,051 B2
(45) Date of Patent: Mar. 24, 2015

(54) GEOMETRY SIMPLIFICATION APPARATUS, GEOMETRY SIMPLIFICATION METHOD, AND PROGRAM

(75) Inventor: Hironori Takashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 382 days.

(21) Appl. No.: 13/509,756

(22) PCT Filed: Nov. 19, 2010

(86) PCT No.: PCT/JP2010/006802
§ 371 (c)(1),
(2), (4) Date: May 14, 2012

(87) PCT Pub. No.: WO2011/064973
PCT Pub. Date: Jun. 3, 2011

(65) Prior Publication Data
US 2012/0278049 A1    Nov. 1, 2012

(30) Foreign Application Priority Data
Nov. 30, 2009 (JP) ................................. 2009-272425

(51) Int. Cl.
*G06F 17/50* (2006.01)
(52) U.S. Cl.
CPC ............................... *G06F 17/5036* (2013.01)
USPC ................... 703/1; 700/97; 700/98; 345/420
(58) Field of Classification Search
CPC . G06F 17/5036; G06F 17/5018; G06F 17/00; G06T 17/20; G06T 19/20; G06T 2219/2021
USPC .................... 703/1; 700/97–98; 345/419–420
See application file for complete search history.

(56) References Cited

U.S. PATENT DOCUMENTS

2008/0034023 A1* 2/2008 Nagano .......................... 708/100

FOREIGN PATENT DOCUMENTS

| JP | 7-114592 A | 5/1995 |
| JP | 2006-185276 A | 7/2006 |
| JP | 2008-217709 A | 9/2008 |

OTHER PUBLICATIONS

Ponamgi et al. "Incremental Algorithms for collision Detetion Between Polygonal Models". 1997 IEEE. p. 51-64.*

* cited by examiner

*Primary Examiner* — Eunhee Kim
(74) *Attorney, Agent, or Firm* — Canon USA Inc IP Division

(57) ABSTRACT

A geometry simplification apparatus includes a determination unit configured to determine whether another component is in contact with a simplification target place, a simplification unit configured to simplify the geometry of the simplification target place, a determination unit configured to determine whether another component is in contact with the simplification target place of which the geometry is simplified, a comparison unit configured to compare contact relationship between another component and the simplification target place before and after the simplification of the geometry of the simplification target place, and a correction unit configured to correct the geometry of the component in which the geometry of the simplification target place is simplified to a geometry which does not interfere with another component according to comparison results by the contact relationship comparison unit.

13 Claims, 11 Drawing Sheets

[Fig. 1]
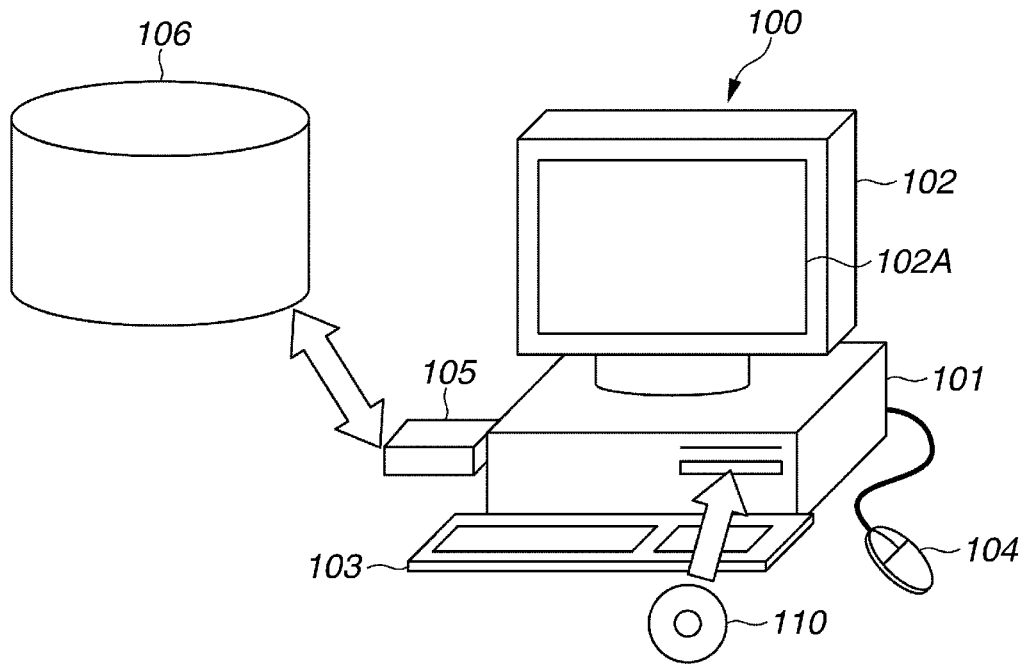
[Fig. 2]
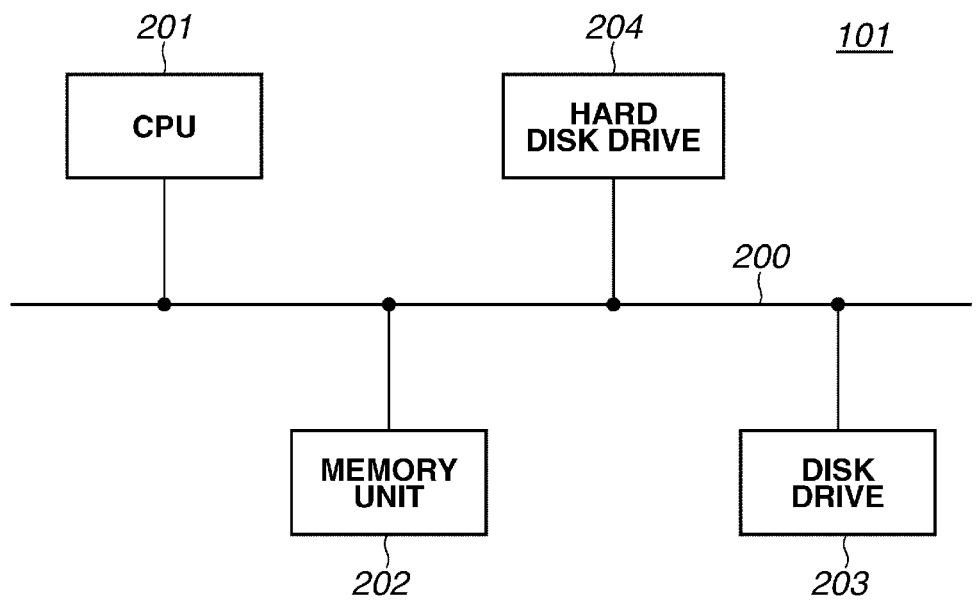

[Fig. 3]
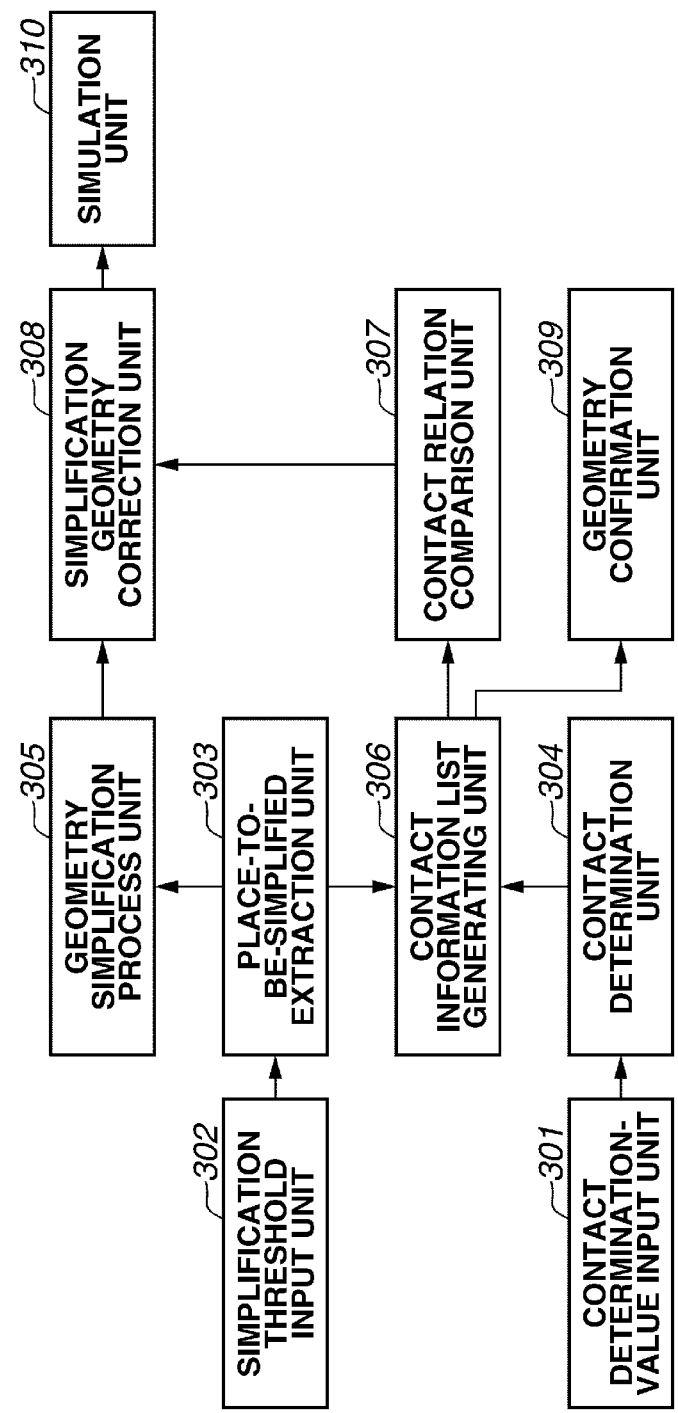

[Fig. 4]
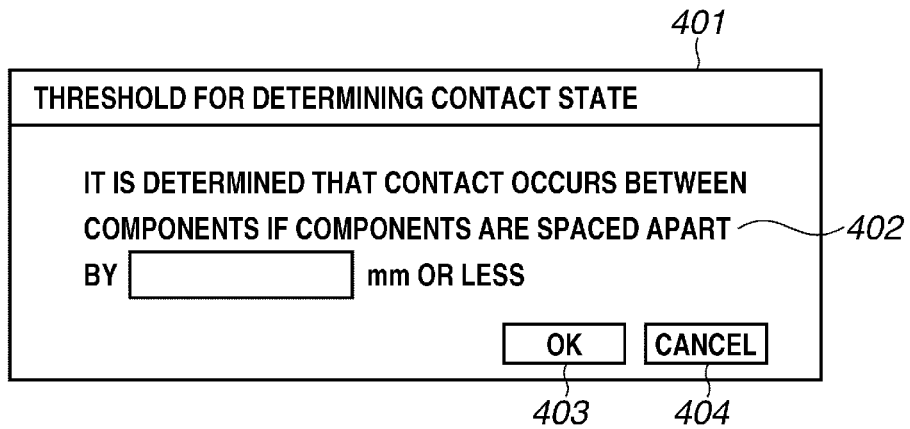
[Fig. 5]
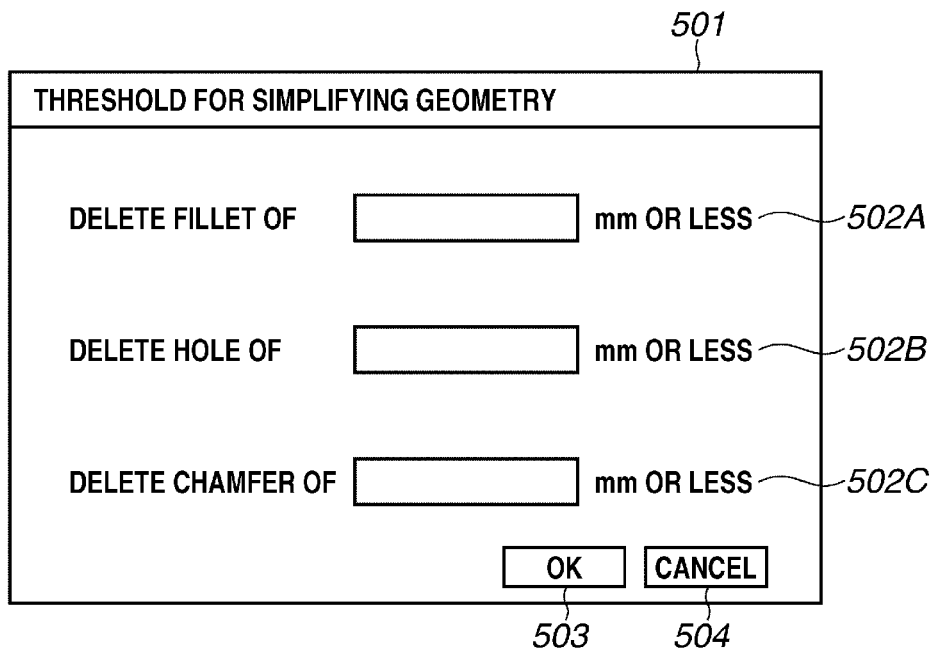

[Fig. 6A]
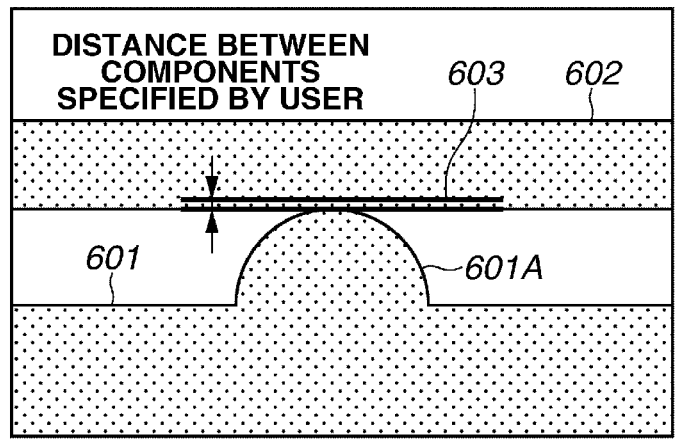
[Fig. 6B]
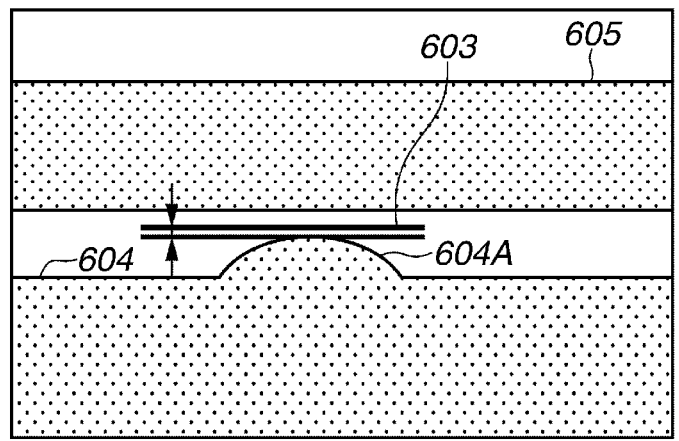

[Fig. 7]
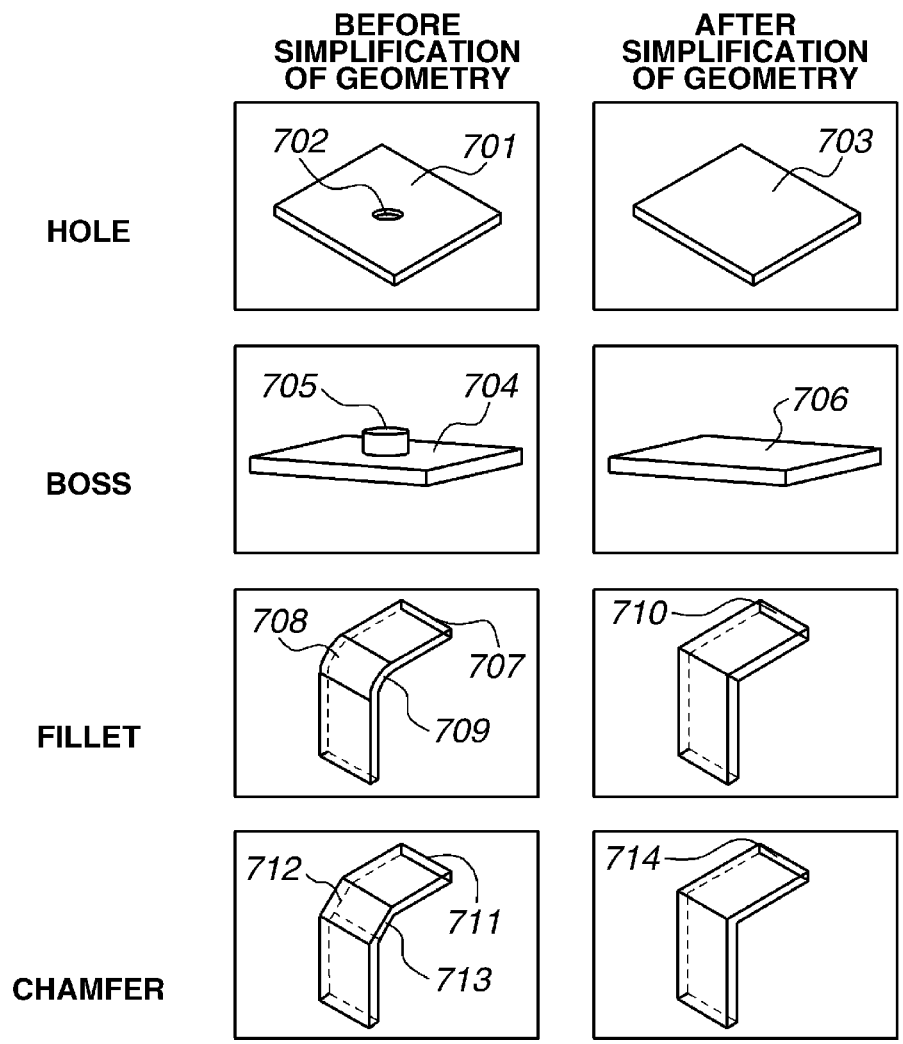

[Fig. 8]

| | BEFORE SIMPLIFICATION | | AFTER SIMPLIFICATION | |
|---|---|---|---|---|
| NAME OF COMPONENT TO BE SIMPLIFIED PLACE TO BE SIMPLIFIED | RESULT OF CONTACT DETERMINATION | NAME OF CONTACT COMPONENT CONTACT PLACE | RESULT OF CONTACT DETERMINATION | NAME OF CONTACT COMPONENT CONTACT PLACE |
| COMPONENT 901 FACE: 11 | CONTACT OCCURS | COMPONENT 902 FACE: 21 | CONTACT OCCURS | COMPONENT 902 FACE: 21 |
| COMPONENT 1001 FACE: 31 | CONTACT OCCURS | COMPONENT 1002 FACE: 41 | NO CONTACT OCCURS | UNAVAILABLE |
| COMPONENT 1001 FACE: 32 | NO CONTACT OCCURS | UNAVAILABLE | CONTACT OCCURS | COMPONENT 1101 FACE: 51 |
| COMPONENT 1101 FACE: 52 | NO CONTACT OCCURS | UNAVAILABLE | NO CONTACT OCCURS | UNAVAILABLE |
| ... | ... | ... | ... | ... |

801 802 803 804 805

[Fig. 9]
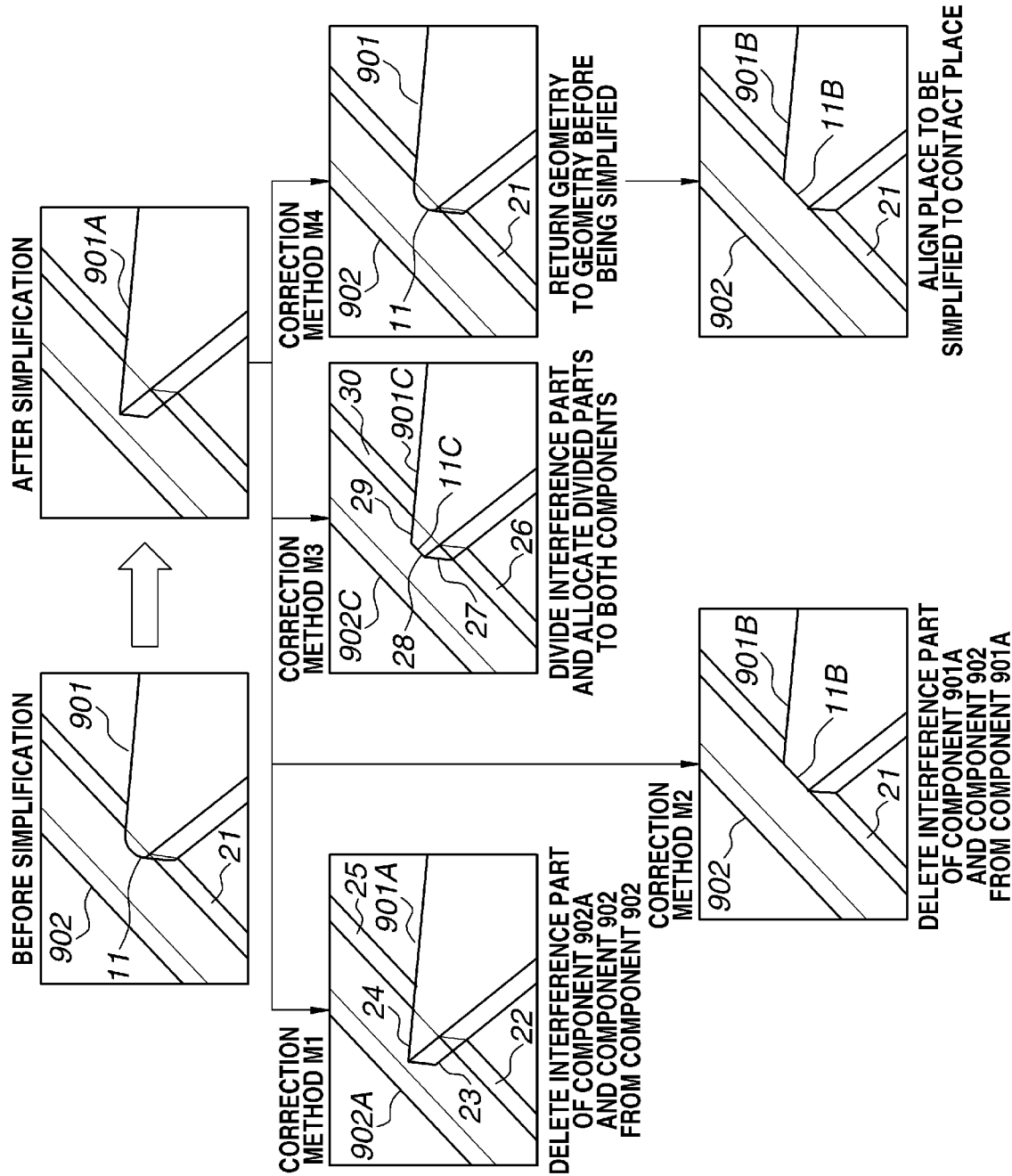

[Fig. 10]
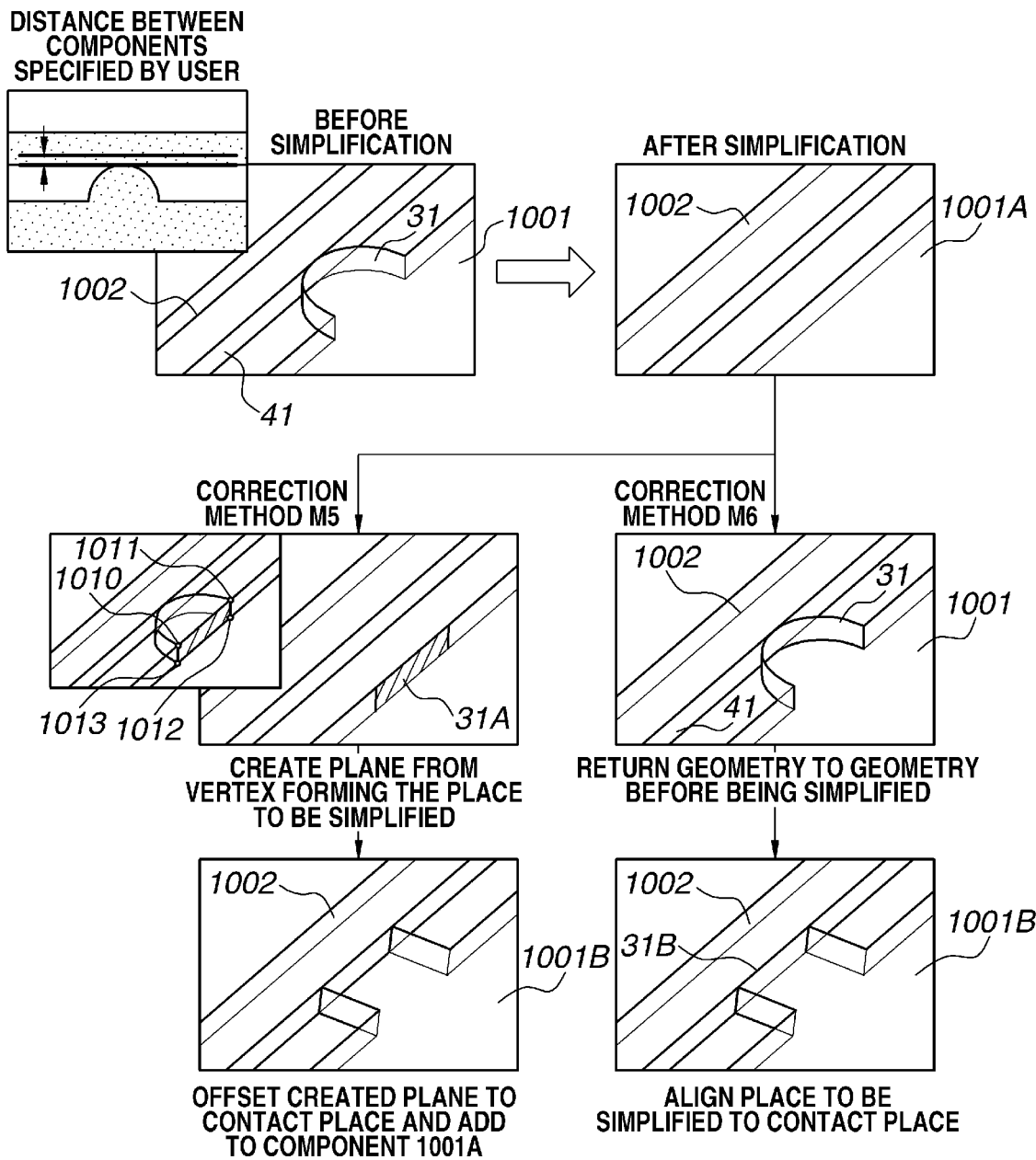

[Fig. 11]
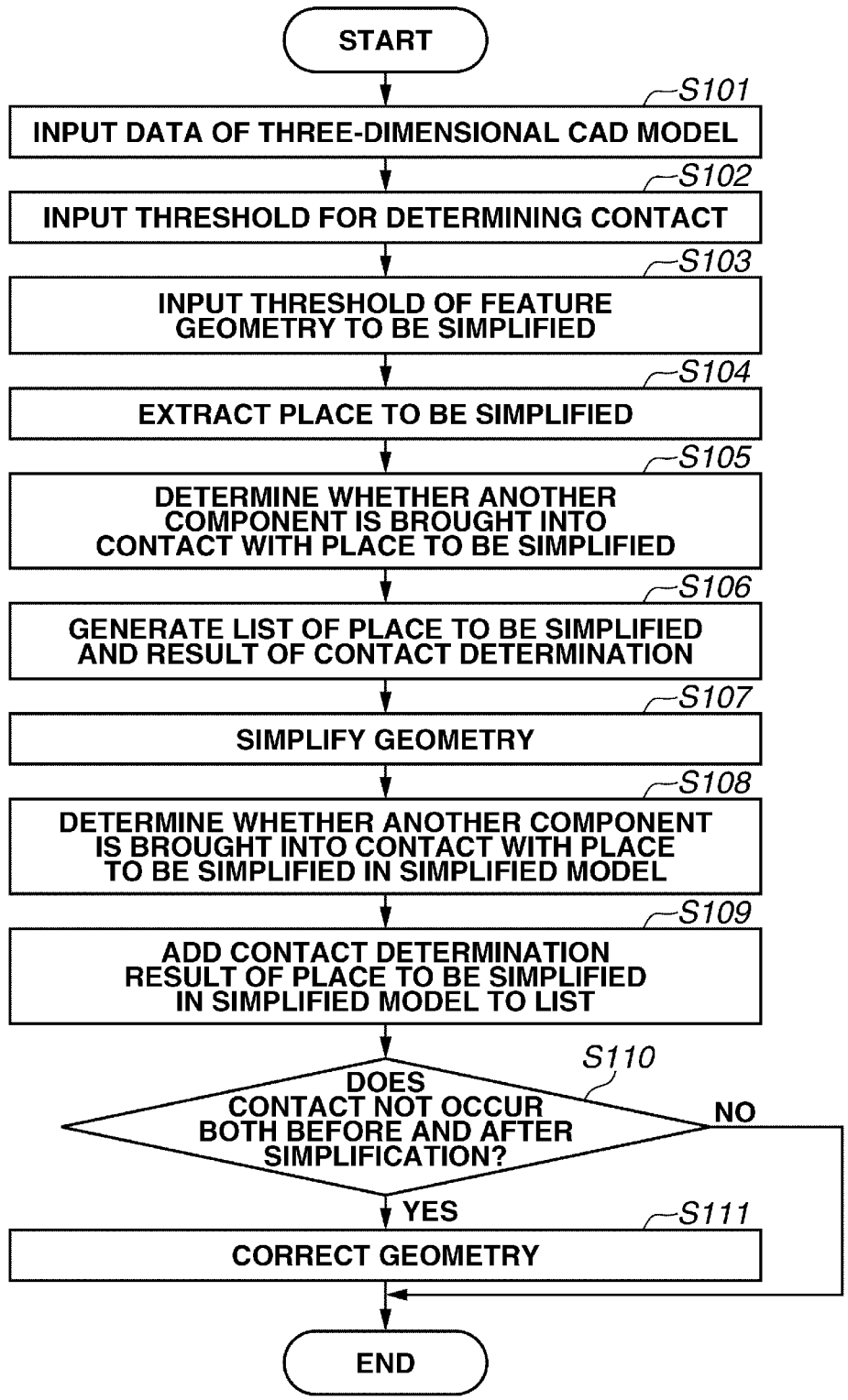

[Fig. 12]

| NAME OF COMPONENT TO BE SIMPLIFIED PLACE TO BE SIMPLIFIED | BEFORE SIMPLIFICATION ~1201 | | | | AFTER SIMPLIFICATION | | |
|---|---|---|---|---|---|---|---|
| | MATERIAL ELECTRICAL CONDUCTIVITY [S/m] | RESULT OF CONTACT DETERMINATION | NAME OF CONTACT COMPONENT CONTACT PLACE | MATERIAL ELECTRICAL CONDUCTIVITY [S/m] | RESULT OF CONTACT DETERMINATION | NAME OF CONTACT COMPONENT CONTACT PLACE ~1202 | MATERIAL ELECTRICAL CONDUCTIVITY [S/m] ~1203 |
| ... | ... | ... | ... | ... | ... | ... | ... |
| COMPONENT 1301 FACE: 61 | FR4 0 | CONTACT OCCURS | COMPONENT 1302 FACE: 71 | COPPER $5.8 \times 10^7$ | NO CONTACT OCCURS | UNAVAILABLE | — — |
| COMPONENT 1401 FACE: 81 | COPPER $5.8 \times 10^7$ | NO CONTACT OCCURS | UNAVAILABLE | — — | CONTACT OCCURS | COMPONENT 1402 FACE: 91 | POLYIMIDE 0 |
| ... | ... | ... | ... | ... | ... | ... | ... |

[Fig. 13]
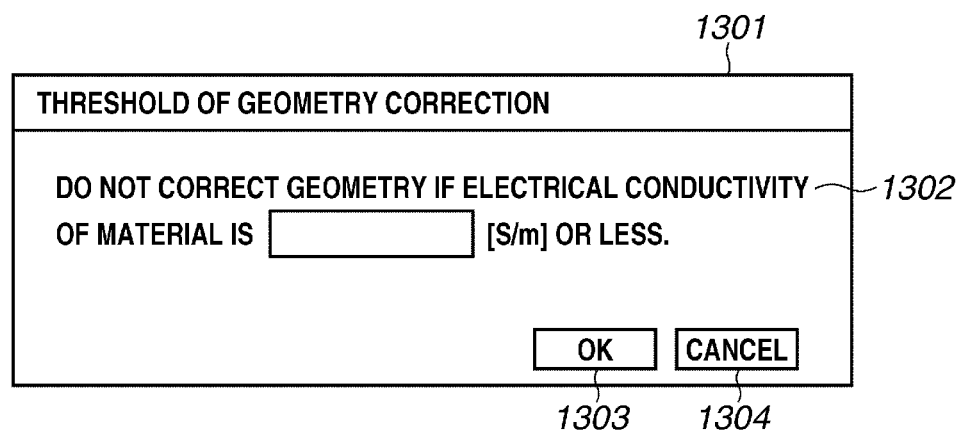

GEOMETRY SIMPLIFICATION APPARATUS, GEOMETRY SIMPLIFICATION METHOD, AND PROGRAM

TECHNICAL FIELD

The present invention relates to a technique for increasing work efficiency in creating a numerical analysis model from a CAD model to be analyzed, for example.

BACKGROUND ART

Computer aided design (CAD) has been widely used to design a component and a product. An analysis using a finite element method can be taken as one of methods for utilizing a three-dimensional CAD model (hereinafter referred to as a CAD model) created by the CAD. If a complicated geometry and/or a minute geometry exists in utilizing the CAD model for analysis, much time is taken up, so that a geometry simplification (hereinafter referred to as simplification, for short) is generally performed in which the complicated geometry and/or the minute geometry is corrected to a simple geometry keeping a calculation accuracy to some extent. When a simplified model in which the CAD model is simplified is used as a numerical analysis model (hereinafter referred to as analysis model, for short), the change in a contact relationship between components made of a conductive material affects a calculation accuracy particularly in an electromagnetic-field analysis, so that an analysis model showing contact relationship similar to the CAD model needs to be created.

Until now, a technique has been known in which interference parts between components are automatically extracted and corrected to correct a geometry after simplification (refer to Japanese Patent Application Laid-Open No. 2008-217709). The technique discussed in Japanese Patent Application Laid-Open No. 2008-217709 is such that interference parts between components are extracted and the geometry of interference parts of the one of interfering components is deleted or the interference parts are divided to the number of the interfering components and an additional process is executed to components corresponding to respective divided parts. Another technique has been known in which clearance or interference between the components that does not exist in the CAD model and appears in creating the analysis model, is eliminated (refer to Japanese Patent Application Laid-Open No. 2006-185276). The technique discussed in Japanese Patent Application Laid-Open No. 2006-185276 is such that, in an analysis model in which the CAD model of each component is divided into a rectangular parallelepiped, if a face which has been brought into close contact in the CAD model is brought into non-close contact, a process is executed to eliminate the part where the face is not in close contact.

In the technique discussed in Japanese Patent Application Laid-Open No. 2008-217709, however, if the components not originally in contact with each other interfere due to the simplification, the components are in contact with each other even if the interfere parts are eliminated. In the technique discussed in Japanese Patent Application Laid-Open No. 2006-185276, although components are not yet brought into close contact in the CAD model, if components are brought into close contact in the analysis model in which the CAD model of each component is divided into a rectangular parallelepiped, the components cannot be corrected to a state where the components are not in close contact, and the components are kept in close contact. There is a problem that much time is taken to create the analysis model because the user manually simplifies and corrects the geometry while visually checking the geometry to prevent change of the contact between the components when creating the analysis model for performing the electromagnetic-field analysis.

CITATION LIST

Patent Literature

PTL 1: Japanese Patent Application Laid-Open No. 2008-217709
PTL 2: Japanese Patent Application Laid-Open No. 2006-185276

SUMMARY OF INVENTION

The present invention is directed to effectively create the analysis model which keeps calculation accuracy and in which the electromagnetic-field analysis can be performed.

According to an aspect of the present invention, a geometry simplification apparatus includes an extraction unit configured to extract an simplification target place of a component, a first determination unit configured to determine whether another component is in contact with the simplification target place, a simplification unit configured to simplify the geometry of the simplification target place, a second determination unit configured to determine whether another component is in contact with the simplification target place of which the geometry is simplified by the simplification unit, a comparison unit configured to compare contact relationship between another component and the simplification target place before and after the geometry of the simplification target place is simplified based on the determination results of the first and second determination units, and a correction unit configured to correct the geometry of the component in which the geometry of the simplification target place is simplified by the simplification unit to a geometry which does not interfere with another component while keeping the initial contact relationship between another component and the component before the geometry of the simplification target place is simplified by the simplification unit according to comparison results by the comparison unit.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

[FIG. 1] FIG. 1 is a perspective view illustrating a computer system according to the present exemplary embodiment.

[FIG. 2] FIG. 2 is a block diagram illustrating a configuration of a principal part in the main body of the computer system according to present exemplary embodiment.

[FIG. 3] FIG. 3 is a block diagram illustrating a functional configuration of the computer system according to a first exemplary embodiment.

[FIG. 4] FIG. 4 is an example of a setting screen for a user setting a distance between components.

[FIG. 5] FIG. 5 is an example of a setting screen for the user setting a threshold of feature geometry.

[FIG. 6A] FIG. 6A is a schematic diagram describing a determination as to whether another component is in contact with a simplification target place.

[FIG. 6B] FIG. 6B is a schematic diagram describing a determination as to whether another component is in contact with a simplification target place.

[FIG. 7] FIG. 7 is schematic diagrams illustrating geometry data before and after the simplification of each feature geometry.

[FIG. 8] FIG. 8 is an example of the contact information list to which the name of a contact component and a contact place are added.

[FIG. 9] FIG. 9 illustrates a correction method for eliminating an interference part.

[FIG. 10] FIG. 10 illustrates a correction method in a case where the simplification causes the simplified model not to contact with a component.

[FIG. 11] FIG. 11 is a flow chart illustrating a process of the computer system according to the first exemplary embodiment.

[FIG. 12] FIG. 12 is an example of a contact information list according to a second exemplary embodiment.

[FIG. 13] FIG. 13 illustrates an example of a setting screen to which electrical conductivity as a threshold is input.

DESCRIPTION OF EMBODIMENTS

Various exemplary embodiments, features, and aspects of the invention will be described in detail below with reference to the drawings. It should be noted that the relative arrangement of the components, the numerical expressions and numerical values set forth in these embodiments do not limit the scope of the present invention unless it is specifically stated otherwise.

A first exemplary embodiment is described below. As the first exemplary embodiment, an exemplary embodiment is described in a case where the present invention is applied to a computer system. FIG. 1 is a perspective view illustrating a computer system according to the first exemplary embodiment. In a computer system 100 illustrated in FIG. 1, a main body unit 101 incorporates a CPU, a disk drive, and others. A display 102 displays an image such as the CAD model on a display screen 102A in accordance with instructions from the main body unit 101. A keyboard 103 of the computer system 100 is used for inputting various information. A mouse 104 designates any position on the display screen 102A of the display 102. A modem 105 accesses an external database to download programs stored in other computer systems.

A program (CAD software) causing the computer system 100 to have at least a CAD function is stored in a portable recording medium such as a disk 110 or downloaded from a recording medium 106 of other computer systems using a communication apparatus such as a modem 105. The downloaded program is input to the computer system 100 and compiled. The program operates the computer system 100 (specifically, a CPU 201) as a CAD system having the CAD function. Among computer readable recording media such as the disk 110, for example, are a magnetic disk such as the disk 110, an IC card memory, and a floppy (registered trade mark) disk, a magneto-optical disk, and a CD-ROM. The recording media are not limited to the above portable recording media. The recording media include, for example, various recording media which can be accessed by a computer system connected via communication apparatus or communication unit such as a modem 105 or a LAN.

FIG. 2 is a block diagram illustrating a configuration of a principal part in the main body 101 of the computer system 100. In FIG. 2, the main body unit 101 includes a CPU 201, a memory unit 202 made of a RAM and a ROM, a disk drive 203 for the disk 110, and a hard disk drive 204 which are connected with one another via a bus 200. In the present exemplary embodiment, the display 102, the keyboard 103, and the mouse 104 are also connected to the CPU 201 via the bus 200, but may be directly connected to the CPU 201. The display 102 may be connected to the CPU 201 via a known graphic interface (not illustrated) for processing input and output image data.

In the computer system 100, the keyboard 103 and the mouse 104 constitute the input unit of the CAD system. The display 102 constitutes an output unit for displaying the CAD model on the display screen 102A. The configuration of the computer system 100 is not limited to that illustrated in FIGS. 1 and 2, but various known configurations may be utilized.

FIG. 3 is a block diagram illustrating a functional configuration of the computer system 100 according to the present exemplary embodiment. The function of each block is realized by the CPU 201 executing the program (CAD software). In FIG. 3, a contact determination-value input unit 301 is the one for inputting a distance between components to determine whether the components are in contact. A simplification threshold input unit 302 inputs a referential dimension as a threshold at the time of extracting feature geometry as a simplification target place. A "simplification target place extraction unit" 303 extracts feature geometry being a dimension not greater than the threshold, as a simplification target place based on the threshold input by the simplification threshold input unit 302. A contact determination unit 304 determines that components are in contact with each other if another component exists in the distance between components input by the contact determination-value input unit 301 or if the components interfere with another component. A geometry simplification process unit 305 subjects the " simplification target place " extracted by the "simplification target place extraction unit" 303 to simplification process. A contact information list generating unit 306 generates a list of the " simplification target place " extracted by the "simplification target place extraction unit" 303 and the results of determining geometry before and after the simplification by the contact determination unit 304 (hereinafter referred to as a contact information list). A contact relation comparison unit 307 compares contact relationship between another component and a component in geometry before and after the simplification with reference to the contact information list generated by the contact information list generating unit 306. A simplification geometry correction unit 308 corrects the simplification model created by the geometry simplification process unit 305 into a simplification model which does not cause interference between components while keeping an original contact relationship. A geometry confirmation unit 309 is the one for the user confirming geometry before and after simplification based on the contact information list generated by the contact information list generating unit 306. A simulation unit 310 is the one for simulating the analysis model being the simplification model corrected by the simplification geometry correction unit 308. The simulation includes analysis, evaluation, and optimization. The simulation itself may be a known one. The computer system 100 is an example of a configuration of the geometry simplification apparatus. The "simplification target place extraction unit" 303 is an example of application of an extraction unit. The contact determination unit 304 is an example of application of first and second determination units. The geometry simplification process unit 305 is an example of application of a simplification unit. The contact relation comparison unit 307 is an example of application of a comparison unit. The simplification geometry correction unit 308 is an example of application of a correction unit. The contact determination-value input unit 301 is an example of application of a third input unit. The simplification threshold input unit 302 is an example of application of a second input unit.

The process of the computer system 100 according to the first exemplary embodiment is described below with reference to a flow chart illustrated in FIG. 11. FIG. 11 is a flow chart illustrating a process of geometry simplification according to the present exemplary embodiment. The process is performed by the CPU 201 executing the program.

In step S101, the main body unit 101 of the computer system 100 inputs the CAD model to be designed. The CAD model may be input from the input unit of the computer system 100, a storage unit such as a RAM and a ROM, or other computer systems via a communication circuit. Alternatively, the CAD model may be input from an external recording medium (for example, the disk 110) of the computer system 100. In step S102, the contact determination-value input unit 301 inputs a distance between components as a threshold determining whether different components are in contact with each other into the CAD model formed of a plurality of components input in step S101. An example of a setting screen 401 for the user setting a distance between components and displayed by the function of the contact determination-value input unit 301 is illustrated in FIG. 4. The user inputs an arbitrary value as a threshold for determining a contact state into an input window 402 on the setting screen 401. The user presses an OK button 403 if the input value is determined as a threshold or a cancel button 404 if the input value is to be cancelled. If the OK button is pressed, contact determination-value input unit 301 inputs the threshold which is set by the user and determines whether contact exists. Although an example is cited above where the user arbitrarily input the threshold, the threshold may be previously set in a program to omit the processing in step S102.

In step S103, the simplification threshold input unit 302 inputs the threshold of feature geometry to be simplified to the CAD model input in step S101. FIG. 5 illustrates an example of a setting screen 501 which is displayed by the function of the simplification threshold input unit 302 and on which the user sets the threshold of feature geometry. The user inputs dimensions of feature geometry such as a fillet, a hole, and a chamfer into input windows 502A, 502B, and 502C on the setting screen 501 respectively. The feature geometry of which the dimension is not greater than the threshold input and set here is simplified. The user inputs the thresholds of the feature geometry to be simplified into the input windows 502A, 502B, and 502C and presses the OK button 503 if the input thresholds are determined or the cancel button 504 if the input thresholds are to be cancelled. If the OK button 503 is pressed, the simplification threshold input unit 302 inputs the threshold of the feature geometry set by the user. In step S104, if the OK button 503 is pressed, the "simplification target place extraction unit" 303 extracts a simplification target place (hereinafter referred to as a simplification target place) from the CAD model. In the input windows 502A, 502B, and 502C, a single feature geometry to be simplified may be selected, or a plurality of feature geometries may be selected. The feature geometry cited in the present exemplary embodiment is merely an example and another feature geometry is also effective.

In step S105, the contact determination unit 304 determines whether another component is in contact with the "simplification target place" extracted in step S104 using the distance between components being the threshold input in step S102. FIGS. 6A and 6B are schematic diagrams describing a determination as to whether another component is in contact with the simplification target place. FIG. 6A illustrates the case where it is determined that another component is in contact with the simplification target place. FIG. 6B illustrates the case where it is determined that another component is not in contact with the simplification target place. In FIG. 6A, another component 602 exists in the vicinity of a "simplification target place" 601A existing in a component 601. Since another component 602 exists at a distance within a "distance between components" 603 input by the contact determination-value input unit 301 when viewed from the "simplification target place" 601A, it is determined that another component 602 is in contact with the "simplification target place" 601A. In FIG. 6B, another component 605 exists in the vicinity of a "simplification target place" 604A existing in a component 604. Since another component 605 does not exist at a distance within a "distance between components" 603 input by the contact determination-value input unit 301 in the "simplification target place" 604A, it is determined that another component 605 is not in contact with the "simplification target place" 604A.

In step S106, the contact information list generating unit 306 gathers results in which the contact determination unit 304 performs a contact determination to all the places to be simplified as a list to generate a contact information list. The contact information list includes a simplification target place, and the name of a component to be simplified which are extracted in step S104, the result of a determination as to whether another component is in contact with the simplification target place in step S105, the name of contact component and a contact place if another component is in contact with the simplification target place.

In step S107, the geometry simplification process unit 305 simplifies the "simplification target place" extracted in step S104. FIGS. 7A to 7D are schematic diagrams illustrating geometry data before and after the simplification of each feature geometry. In the CAD model yet to be simplified in FIG. 7A, a hole 702 penetrates through a component 701. The hole 702 is subjected to an embedding process to provide a simplified model like a component 703. In the CAD model yet to be simplified in FIG. 7B, a boss 705 exists on a component 704. The boss 705 is subjected to a deletion process to provide a flat simplified model like a component 706. In the CAD model yet to be simplified in FIG. 7C, fillets 708 and 709 exist on both faces of the bend of a component 707. The fillets 708 and 709 are right-angled to provide a simplified model like a component 710. In the CAD model yet to be simplified in FIG. 7D, chamfers 712 and 713 exist on both faces of the bend of a component 711. The chamfers 712 and 713 are right-angled to provide a simplified model like a component 714. Thus, the geometry simplification process unit 305 subjects each feature geometry to a determined geometry process to create the simplification model.

In step S108, the contact determination unit 304 determines again whether another component is in contact with the simplification model created in step S107 based on the threshold of the distance between components input in step S102. If the contact determination unit 304 determines that another component is in contact with the simplification model, in step S109, the contact information list generating unit 306 adds the name of a contact component and a contact place to the contact information list.

FIG. 8 is an example of the contact information list to which the name of a contact component and a contact place are added. The contact relation comparison unit 307 refers to a contact information list 801 to compare the results of determination of contact obtained before and after simplification. In step S110, if it is determined that another component is not in contact with the simplification model both before and after simplification on a line 805, for example (NO in step S110), the simplification process for the simplification target place is ended. Otherwise (YES in step S110), like lines 802, 803, and 804, the processing proceeds to step S111 to create the simplification model which keeps an original contact relation and is corrected not to interfere, and the processing is ended.

A method for correction process about respective cases of the lines 802, 803, and 804 requiring the correction process is described below. A method for correction process on the line 802 is described. Referring to the line 802 of the contact information list 801 in FIG. 8, it is determined that a face 11 of a component 901 being the simplification target place is in contact with a component 902 both before and after simplification. In this case, it is presumed that the component 901 has already interfered with the component 902 with which the component 901 is in contact even before simplification and the component 901 has interfered with the component 902 even after simplification. A calculation may not be performed with the component 901 being in contact with another component 902, which requires the correction process for eliminating an interference part.

FIG. 9 illustrates a correction method for eliminating an interference part. In the CAD model yet to be simplified, the face 11 of the component 901 has been already in contact with the component 902. Even a simplified component 901A interferes therewith. In this case, the interference needs to be eliminated with the contact between the components 901 and 902 kept. Four examples of correction methods therefor are described below.

In the correction methods M1 and M2, an interference part is extracted between interfering components and deleted from the one component. A component from which the interference part is deleted may be specified by the user or automatically determined from its volume or the electrical conductivity of a material allocated to each component.

In the correction method M1 in FIG. 9, the interference part between the simplified component 901A and the contacting component 902 is deleted from the component 902 to eliminate the interference. At this point, the contact face 21 of the contact component 902 is replaced with faces 22, 23, 24, and 25. A component 902A of which the geometry is corrected is produced.

In the correction method M2, the interference part between the simplified component 901A and the contacting component 902 is deleted from the component 901A to eliminate the interference. A face 11 with a curved geometry is flattened to a face 11B flush with the face 21 to produce a component 901B of which the geometry is corrected.

In the correction method M3, an interference part is extracted and the interference part is divided to the number of interfering components and allocated to respective components. In FIG. 9, the interference part between the simplified component 901A and the component 902 is extracted, divided and allocated to respective components. As a result, a face 11 with a curved geometry is flattened to a face 11C to produce a component 901C of which the geometry is corrected. The contact face 21 of the contact component 902 is replaced with faces 26, 27, 28, 29, and 30. A component 902C of which the geometry is corrected is produced.

In the correction method M4, the geometry is returned to the geometry yet to be simplified and the face being the simplification target place is aligned to the contact face of the contacting component. In FIG. 9, the face 11 being the simplification target place of the component 901 of which the geometry is returned to the geometry yet to be simplified is aligned to a contact face 21 of the contacting component 902. As a result, the face 11 with a curved geometry is flattened to the face 11B flush with the face 21 to produce a component 901B of which the geometry is corrected. When any of the correction processes described above is performed, the simplified model can be created from which interference is eliminated with the initial contact kept even if the simplified model interferes.

A method for the correction process on the line 803 is described below. Referring to the line 803 of the contact information list 801 in FIG. 8, it is determined that a face 31 of a component 901 being the simplification target place is in contact with a component 1002 in the CAD model yet to be simplified, but it is determined that the simplified model is not in contact. In this case, the simplified model also needs to be corrected to contact the component 1002 in order to keep calculation accuracy. Two examples of methods for correcting the simplified model are described below.

FIG. 10 illustrates a correction method in a case where the simplification brings the simplified model into no contact with a component. In the correction method M5, a plane is created by the vertexes forming the simplification target place and the created plane is offset to be added to the separate simplified model. In FIG. 10, a place 31A is created by four vertexes (points 1010, 1011, 1012, and 1013) forming a plane 31 of a component 1001. The created plane 31A is offset to a contact place 41 of an originally contacting component 1002 and added to a component 1001A, thereby producing a component 1001B of which the geometry is corrected.

In the correction method M6, as is the case with the foregoing correction method M4, the geometry is returned to the geometry yet to be simplified and the face being the simplification target place is aligned to the contact face of the contacting component. In FIG. 10, the face 31 of the component 1001 of which the geometry is returned to the geometry yet to be simplified is aligned to a contact face 41 of the contacting component 1002. As a result, the face 31 with a curved geometry is flattened to the face 31B flush with the face 41 to produce a component 1001B of which the geometry is corrected.

When any of the correction processes described above is performed, the simplified model can be created with the initial contact relationship kept even if contact is lost by the simplification.

A method for the correction process on the line 804 is described below. Referring to the line 804 of the contact information list 801 in FIG. 8, it is determined that a face 32 of the component 1001 being the simplification target place is not in contact in the CAD model yet to be simplified, but it is determined that the simplified model is in contact with the component 1101. In this case, the simplified model also needs to be corrected to come into no contact with the component 1101 in order to keep calculation accuracy. Two examples of methods for correcting the simplified model are described below.

In the correction method M7, an interfering part is extracted by simplification. A new face created by deleting the interfering part from the simplified component is offset at a place spaced away from the contact face by a distance between components specified by the user, thereby producing a component of which the geometry is corrected.

In the correction method M8, as is the case with the foregoing correction method M4, the geometry is returned to the geometry yet to be simplified and the face being the simplification target place is aligned to the cont ct face of the contacting component in the simplified model. The face being the aligned simplification target place is offset at a place spaced away from the contact face by a distance between components specified by the user, thereby producing a component of which the geometry is corrected.

When any of the correction processes described above is performed, the simplified model can be created with the initial contact relationship kept even if contact or interference is caused by the simplification. The above geometry correction process is carried out in the simplification geometry correction unit 308. If there is a correction method frequently used by the user for each pattern of comparison results in the contact relation comparison unit 307, the geometry correction process may be automatically carried out by the correction method or the user may select a correction method in an interactive manner on a case-by-case basis. In the determination in step S110, if it is determined that another component is not in contact with the simplification target place both before and after the simplification of the "simplification target place," the user may be caused to select whether the geometry of the component is corrected by the simplification geometry correction unit 308, the geometry of the component after the simplification of the geometry by the simplification unit is stored, or the geometry of the component is returned to that of the component before the simplification of the geometry.

The user can easily confirm the simplified model of which the geometry is corrected through the geometry confirmation unit 309. For example, a line corresponding to a place which the user wants to confirm may be selected using the contact information list to arrange models on the line before and after the simplification and the models may be highlighted or displayed so as to fit the screen. Alternatively, only the components may be displayed. The geometry confirmation unit 309 is an example of application of a display unit.

The simplified model thus created is simulated. The simulation includes analysis, evaluation, and optimization. Analysis only may be performed. Alternatively, analysis and evaluation, or analysis, evaluation, and optimization may also be performed.

A second exemplary embodiment is described below. In the first exemplary embodiment, the method for simplifying geometry with contact relationship kept is described. In the present exemplary embodiment, an example is described where geometry correction after simplification is omitted by the physical property of a component. More specifically, the first exemplary embodiment describes the method for simplifying geometry with contact relationship kept to reduce the influence on calculation accuracy. However, the influence on calculation accuracy can be small depending on the physical property of a component even if contact relationship is not kept. Specifically, a component of an insulator which is low in electrical conductivity and through which a very small current can flow is the case. Therefore, it is possible to omit the process for correcting the geometry of a component of which the contact relationship to another component exerts less influence on the calculation accuracy and which is low in electrical conductivity. This allows decreasing time spent in geometry correction, which improves the efficiency of work.

The computer system according to the present exemplary embodiment is similar in configuration to that in FIG. 1. The principal part in the main body unit of the computer system is also similar in configuration to that in FIG. 2. The computer system according to the present exemplary embodiment, however, is different in functional configuration from that in FIG. 3 and includes a geometry correction threshold input unit described later and a determination unit for determining whether a component is made of a material low in electrical conductivity in addition to the functional configuration illustrated in FIG. 3. The geometry correction threshold input unit is an example of application of a first input unit. The determination unit is an example of application of a third determination unit.

FIG. 12 is a contact information list in the second exemplary embodiment. Since the processing (step S101) for inputting the CAD model up to the processing (step S109) for adding contact determination results to the contact information list, which is performed after simplification, are similar to those in the first exemplary embodiment, the description thereof is omitted.

As illustrated in FIG. 12, a contact information list 1201 according to the present exemplary embodiment includes a material of each component and its electrical conductivity acquired from the attribute information of the CAD model. Geometry is not corrected if a component to be simplified is made of a material low in electrical conductivity (line 1202), a contact component is made of a material low in electrical conductivity (line 1203), or both of the component to be simplified and the contact component are made of a material low in electrical conductivity.

The user may input any electrical conductivity as a threshold for determining whether geometry correction is omitted. FIG. 13 illustrates an example of a setting screen to which electrical conductivity as a threshold is input. The setting screen is displayed by the function of the geometry correction threshold input unit (not illustrated). The user inputs electrical conductivity as a threshold to an input window 1302 on a setting screen 1301. If the threshold is determined, an OK button is pressed. If the threshold is cancelled, a cancel button 1304 is pressed. At this point, the geometry may be automatically corrected based on the threshold input by pressing the button 1303 or the user may make a determination in an interactive manner. The present exemplary embodiment is an example in which the user inputs a threshold for determining whether to arbitrarily omit the geometry correction. The process, however, may be omitted by previously setting the threshold on the program.

In the present exemplary embodiment, although the initial contact relationship is not kept by performing the process described above, the analysis model exerting less influence on the calculation accuracy can be produced. The analysis model thus produced is simulated. The simulation includes analysis, evaluation, and optimization. Analysis only may be performed. However alternatively, analysis and evaluation, or analysis, evaluation, and optimization may also be performed.

In the present exemplary embodiment, the geometry of a component in which the geometry of the simplification target place is simplified is corrected to a geometry which does not interfere with another component with the initial contact relationship kept according to the contact relationship between the simplification target place and another component before and after the simplification of the geometry of the simplification target place. Consequently, the analysis model capable of performing electro-magnetic field analysis with accurate calculation can be effectively created.

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s).

For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-272425 filed Nov. 30, 2009, which is hereby incorporated by reference herein in its entirety.

The invention claimed is:

1. A geometry simplification apparatus comprising:
an extraction unit configured to extract a simplification target place of a component;
a first determination unit configured to determine whether another component is in contact with the simplification target place;
a simplification unit configured to simplify geometry of the simplification target place;
a second determination unit configured to determine whether the another component is in contact with the simplification target place of which the geometry is simplified by the simplification unit;
a comparison unit configured to compare contact relationship between the another component and the simplification target place before and after the geometry of the simplification target place is simplified based on the determination results of the first and second determination units; and
a correction unit configured to correct the geometry of the component in which the geometry of the simplification target place is simplified by the simplification unit to a different geometry which does not interfere with the another component while keeping an initial contact relationship between the another component and the component before the geometry of the simplification target place is simplified by the simplification unit according to comparison results by the comparison unit.

2. The geometry simplification apparatus according to claim 1, further comprising a third determination unit configured to determine whether to omit a process for correcting geometry by the correction unit,
wherein the correction unit does not correct the geometry of the component if the third determination unit determines to omit the process for correcting the geometry of the component by the correction unit.

3. The geometry simplification apparatus according to claim 2, further comprising a first input unit configured to input a threshold related to electrical conductivity,
wherein, if the electrical conductivity of the component is equal to or smaller than the threshold related to the electrical conductivity, the third determination unit determines to omit the process for correcting the geometry of the component by the correction unit.

4. The geometry simplification apparatus according to claim 1, wherein, if the another component is not in contact with the simplification target place both before and after the geometry of the simplification target place is simplified as a result of comparison by the comparison unit, the correction unit corrects the geometry of the component.

5. The geometry simplification apparatus according to claim 1, further comprising a selection unit configured to select whether the geometry of the component is corrected by the correction unit, the geometry of the component after the simplification of the geometry by the simplification unit is stored, or the geometry of the component is returned to the geometry of the component before the simplification of the geometry by the simplification unit, if the another component is not in contact with the simplification target place both before and after the geometry of the simplification target place is simplified as a result of comparison by the comparison unit.

6. The geometry simplification apparatus according to claim 1, further comprising a display unit configured to display the geometry of the component before and after a simplification process is performed by the simplification unit.

7. The geometry simplification apparatus according to claim 6, wherein the display unit highlights the geometry of the component before and after a simplification process is performed by the simplification unit.

8. The geometry simplification apparatus according to claim 6, wherein the display unit displays the geometry of the component before and after a simplification process is performed by the simplification unit so that the geometry of the component is fitted to a screen.

9. The geometry simplification apparatus according to claim 6, wherein the display unit displays only the geometry of the component before and after a simplification process is performed by the simplification.

10. The geometry simplification apparatus according to claim 1, further comprising a second input unit configured to input a threshold related to the dimension of a feature geometry to be simplified,
wherein, the extraction unit extracts a feature geometry of which dimension is equal to or smaller than the dimension of the feature geometry, as the simplification target place.

11. The geometry simplification apparatus according to claims 1, further comprising a third input unit configured to input a threshold related to a distance between components,
wherein, if a distance between the simplification target place and another Component is equal to or smaller than the threshold related to the distance between components, at least any one of the first and second determination units determines that the another component is in contact with the simplification target place.

12. A geometric simplification method comprising:
extracting a simplification target place of a component;
first determining whether another component is in contact with the simplification target place;
simplifying geometry of the simplification target place;
second determining whether another component is in contact with the simplification target place of which the geometry is simplified;
comparing contact relationship between another component and the simplification target place before and after the geometry of the simplification target place is simplified based on the determination results of the first and the second determining; and
correcting the geometry of the component in which the geometry of the simplification target place is simplified to a different geometry which does not interfere with another component while keeping an initial contact relationship between another component and the component before the geometry of the simplification target place is simplified.

13. A non-transitory computer readable storage medium storing a program for causing a computer to execute:
extracting a simplification target place of a component;
first determining whether another component is in contact with the simplification target place;

simplifying geometry of the simplification target place;
second determining whether another component is in contact with the simplification target place of which the geometry is simplified;
comparing contact relationship between another component and the simplification target place before and after the geometry of the simplification target place is simplified based on the determination results of the first and the second determining; and
correcting the geometry of the component in which the geometry of the simplification target place is simplified to a different geometry which does not interfere with another component while keeping an initial contact relationship between another component and the component before the geometry of the simplification target place is simplified.

* * * * *